US006966348B2

(12) United States Patent
Steidl et al.

(10) Patent No.: US 6,966,348 B2

(45) Date of Patent: Nov. 22, 2005

(54) PURGEABLE CONTAINER FOR LOW VAPOR PRESSURE CHEMICALS

(75) Inventors: Thomas Andrew Steidl, Escondido, CA (US); Gildardo Vivanco, San Diego, CA (US); Charles Michael Birtcher, Valley Center, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 196 days.

(21) Appl. No.: 10/669,942

(22) Filed: Sep. 24, 2003

(65) Prior Publication Data

US 2005/0051234 A1 Mar. 10, 2005

Related U.S. Application Data

(63) Continuation-in-part of application No. 10/155,726, filed on May 23, 2002, now Pat. No. 6,648,034.

(51) Int. Cl.[7] ........................ F17C 13/00

(52) U.S. Cl. ........................ 141/302; 141/18; 141/47; 141/63; 141/65; 137/209

(58) Field of Search ........................ 141/18, 21, 65, 141/67, 63, 47–50, 302; 137/206, 209, 238, 240, 606

(56) References Cited

U.S. PATENT DOCUMENTS

| | | | | |
|---|---|---|---|---|
| 3,696,830 A | * 10/1972 | Janu | | 137/209 |
| 3,958,720 A | 5/1976 | Anderson | | 221/93 |
| 4,357,175 A | 11/1982 | Buffington et al. | | 134/10 |
| 4,537,660 A | 8/1985 | McCord | | 202/170 |
| 4,570,799 A | 2/1986 | Mednis | | 206/509 |
| 4,832,753 A | 5/1989 | Cherry et al. | | 134/22.18 |
| 4,865,061 A | 9/1989 | Fowler et al. | | 134/108 |
| 4,871,416 A | 10/1989 | Fukuda | | |
| 5,045,117 A | 9/1991 | Witherell | | 134/21 |

(Continued)

FOREIGN PATENT DOCUMENTS

| | | | |
|---|---|---|---|
| JP | 8115886 | of 1996 | H01L/21/205 |
| WO | 9964780 | 12/1999 | F17C/13/00 |

*Primary Examiner*—J. Casimer Jacyna
(74) *Attorney, Agent, or Firm*—Geoffrey L. Chase

(57) ABSTRACT

A container having two ports; first block valve having two diaphragm valves, each valve having a valve seat side and a diaphragm side, each valve seat side faces the other valve seat side, and connected to the first end of a dispense conduit, one diaphragm side connected to a first port, and another diaphragm side connected to vent and or vacuum; a second valve connected to a push gas conduit and a second port.

10 Claims, 4 Drawing Sheets

U.S. PATENT DOCUMENTS

| | | | | | |
|---|---|---|---|---|---|
| 5,051,135 | A | | 9/1991 | Tanaka et al. | 134/10 |
| 5,106,404 | A | | 4/1992 | Grant | 55/195 |
| 5,108,582 | A | | 4/1992 | Foutsitzis et al. | 208/138 |
| 5,115,576 | A | | 5/1992 | Roberson et al. | 34/15 |
| 5,240,507 | A | | 8/1993 | Gray et al. | 134/21 |
| 5,297,767 | A | | 3/1994 | Miller et al. | 248/311.2 |
| 5,304,253 | A | | 4/1994 | Grant | 134/26 |
| 5,339,844 | A | | 8/1994 | Stanford, Jr. et al. | 134/107 |
| 5,398,846 | A | | 3/1995 | Corba et al. | 222/1 |
| 5,409,141 | A | | 4/1995 | Kikuchi et al. | 222/81 |
| 5,425,183 | A | | 6/1995 | Taylor et al. | 34/73 |
| 5,465,766 | A | | 11/1995 | Siegele et al. | 141/198 |
| 5,469,876 | A | | 11/1995 | Gray et al. | 134/105 |
| 5,472,119 | A | | 12/1995 | Park et al. | 222/145.8 |
| 5,509,431 | A | | 4/1996 | Smith, Jr. et al. | 134/95.1 |
| 5,538,025 | A | | 7/1996 | Gray et al. | 134/105 |
| 5,557,381 | A | | 9/1996 | Sakamoto et al. | 355/260 |
| 5,562,132 | A | | 10/1996 | Siegele et al. | 141/198 |
| 5,562,883 | A | | 10/1996 | Salisbury et al. | 422/133 |
| 5,565,070 | A | | 10/1996 | Doi et al. | 203/91 |
| 5,573,132 | A | | 11/1996 | Kanfer et al. | 220/4.23 |
| 5,590,695 | A | | 1/1997 | Siegele et al. | 141/21 |
| 5,607,002 | A | | 3/1997 | Siegele et al. | 141/198 |
| 5,657,786 | A | * | 8/1997 | DuRoss et al. | 137/15.01 |
| 5,711,354 | A | | 1/1998 | Siegele et al. | 141/198 |
| 5,878,793 | A | | 3/1999 | Siegele et al. | 141/63 |
| 5,964,230 | A | | 10/1999 | Voloshin et al. | 134/98.1 |
| 5,964,254 | A | | 10/1999 | Jackson | 141/21 |
| 6,077,356 | A | | 6/2000 | Bouchard | 118/715 |
| 6,138,691 | A | | 10/2000 | Voloshin et al. | 134/22.11 |
| 6,161,875 | A | | 12/2000 | Yamaji et al. | 285/24 |

* cited by examiner

PURGEABLE CONTAINER FOR LOW VAPOR PRESSURE CHEMICALS

CROSS REFERENCE TO RELATED PATENT APPLICATIONS

The present patent application is a continuation-in-part of allowed U.S. patent application Ser. No. 10/155,726, filed 23 May 2002 now U.S. Pat. No. 6,648,034.

BACKGROUND OF THE INVENTION

The present invention relates to a low dead space easily cleaned manifold for detaching a container of a chemical delivery system, and in particular to an apparatus for delivering high-purity or ultra-high purity chemicals to a use point, such as a semiconductor fabrication facility or tool(s) for chemical deposition. Although the invention may have other applications, it is particularly applicable in semiconductor fabrication.

Semiconductor manufacturers require chemicals having at least a high-purity for production processes to avoid defects in the fabrication of semiconductor devices. The chemicals used in the fabrication of integrated circuits usually must have an ultra-high purity to allow satisfactory process yields. As integrated circuits have decreased in size, there has been an increase in the need to maintain the purity of source chemicals.

One ultra-high purity chemical used in the fabrication of integrated circuits is tetrakis(dimethylamido)titanium (TDMAT). TDMAT is used widely in integrated circuit manufacturing operations, such as chemical vapor deposition (CVD) to form titanium and titanium nitride films, vias and barrier layers.

Integrated circuit fabricators typically require TDMAT with 99.99+% purity, preferably 99.999999+%(8–9's+%) purity. This high degree of purity is necessary to maintain satisfactory process yields. It also necessitates the use of special equipment to contain and deliver the high-purity or ultra-high purity TDMAT to CVD reaction chambers.

High-purity chemicals and ultra-high purity chemicals, such as TDMAT, are delivered from a bulk chemical delivery system to a use point, such as a semiconductor fabrication facility or tool(s). A delivery system for high-purity chemicals is disclosed in U.S. Pat. No. 5,590,695 (Seigele, et al.) which uses two block valve assemblies 76 and 91, but not to facilitate rapid clean disconnection. (Related patents include U.S. Pat. Nos. 5,465,766; 5,562,132; 5,607,002; 5,711,354; 5,878,793 and 5,964,254.) The system comprises: a block valve assembly housing a low pressure vent valve and a carrier gas isolation valve, while the other block valve assembly houses a container bypass valve and a process isolation canister bypass valve. The block valve assemblies are not in series nor are they used for disconnect of a container from a manifold.

Solvent purging systems for removal of low vapor pressure chemicals from process conduits are disclosed in U.S. Pat. No. 5,964,230 and U.S. Pat. No. 6,138,691. Such systems may add additional complexity to purging and increase the amount of materials which must be disposed of.

Low dead space couplings are known, such as U.S. Pat. No. 6,161,875.

TDMAT is considered a low vapor pressure, high purity chemical by the semiconductor industry, and thus presents special problems when breaking a process line or changing out a process container where the line must be cleaned prior to such detachment. Significant time delays in cleaning down a line or conduit are a disadvantage in the throughput of a wafer processing facility, where expensive tools and large batch processing of expensive wafers, each containing hundreds of integrated circuits require fast processing and avoidance of significant or lengthy offline time for cleaning or changeout of process containers or vessels.

The Present invention is more specifically directed to the field of process chemical delivery in the electronics industry and other applications requiring low vapor pressure, high purity chemical delivery. More specifically, the present invention is directed to apparatus for the cleaning of process chemical delivery lines, containers and associated apparatus, particularly during changeout of process chemical or process chemical containers in such process chemical delivery lines, quickly and thoroughly, when processing with low vapor pressure, high purity chemicals.

Evacuation and gas purge of process chemical lines have been used to remove residual chemicals from delivery lines. Both vacuum draw and inert gas purge are successful in quickly removing high volatility chemicals, but are not effective with low volatility chemicals. Safety is a problem when extracting highly toxic materials.

Use of solvents to remove residual chemicals has been suggested to remove low vapor pressure chemicals from process lines when the lines need to be disconnected such as for replacement of a vessel or container for either refill or maintenance. However, solvent systems can be complex and require a source of solvent and a means to handle the contaminated solvent after it has been used for its cleaning function.

Additional patents directed to effective chemical removal are U.S. Pat. No. 6,345,642 and U.S. Pat. No. 6,418,960.

The present invention overcomes the drawbacks of the prior art in purging and cleaning chemical process lines for low vapor pressure chemicals without the requirements of lengthy purge cycles of pressurized gas and vacuum, as will be more fully set forth below.

BRIEF SUMMARY OF THE INVENTION

The present invention is a container having two ports; first block valve having two diaphragm valves, each valve having a valve seat side and a diaphragm side, each valve seat side faces the other valve seat side, and connected to the first end of a dispense conduit, one diaphragm side connected to a first port, and another diaphragm side connected to vent; a second block valve having two diaphragm valves, having a valve seat side and a diaphragm side, wherein each valve seat side faces the other valve seat side, and each valve seat side connected to a push gas conduit, the diaphragm side of one valve connected to vent, and the diaphragm side of another valve connected to a second port.

DETAILED DESCRIPTION OF THE INVENTION

Figure 1A:
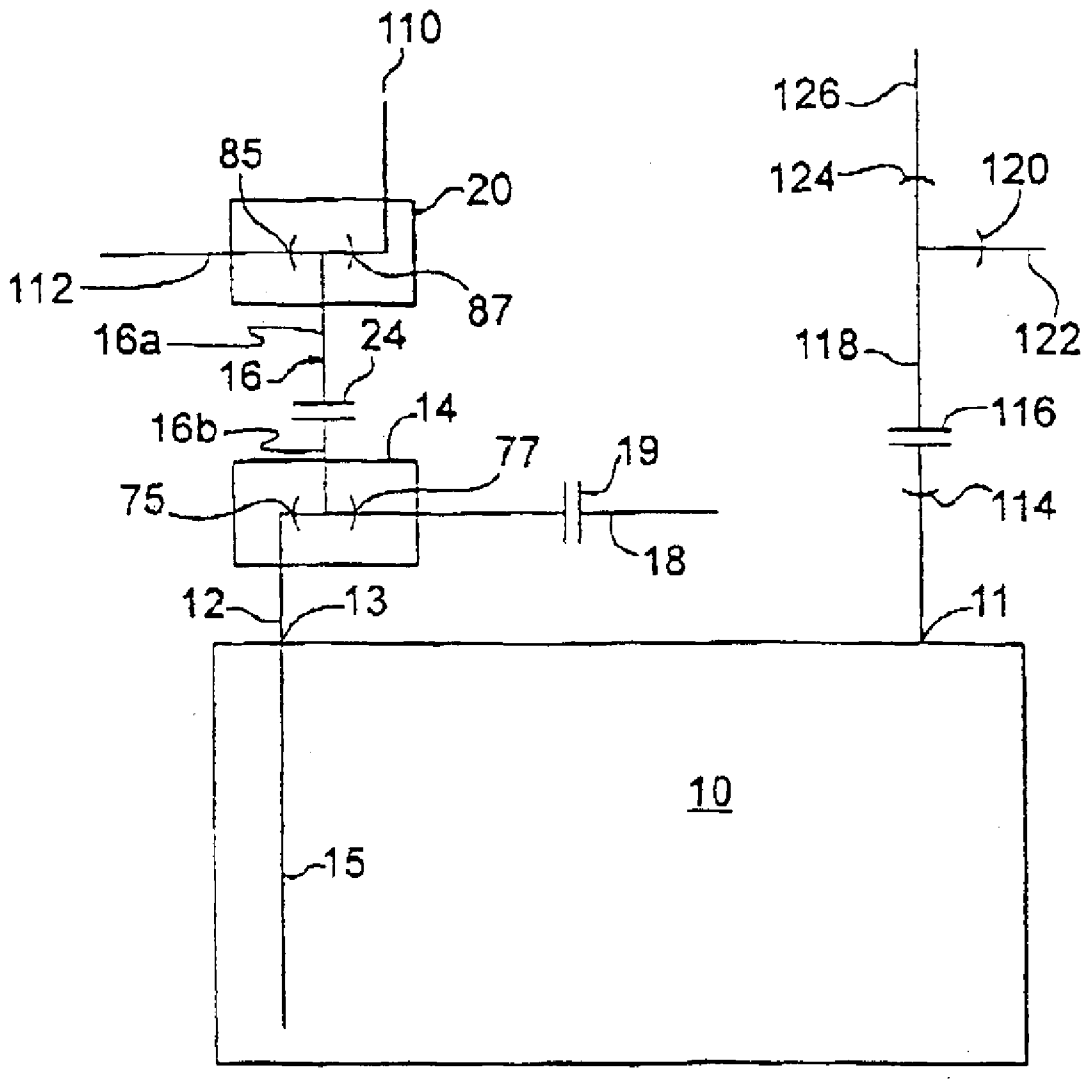
FIG. 1A is a schematic of a first embodiment of the present invention having a block diaphragm valve assembly on one port of a container.

The present invention provides a readily cleanable and purgeable container for dispensing or delivery of low vapor pressure, high purity chemical to a manifold or chemical delivery system, which in turn dispenses the chemical to a process tool or reactor for consumption. The apparatus of the present invention is particularly suited for process chemicals used in the semiconductor industry.

Although the apparatus of the present invention is applicable to low vapor pressure chemicals, such as tetrakis (dimethylamido)titanium, it is also applicable to chemicals which do not have a low vapor pressure, i.e., high vapor pressure chemicals, and thus can be used with a wide array of chemicals.

The container and its related chemical delivery system of the present invention may be used in various applications with various fluids, but has particular application for liquid chemicals that have at least a high purity. For example, the liquid chemical may be selected from the group consisting of tetraethylorthosilicate (TEOS), borazine, aluminum trisec-butoxide, carbon tetrachloride, trichloroethanes, chloroform, trimethylphosphite, dichloroethylenes, trimethylborate, dichloromethane, titanium n-butoxide, diethylsilane, hexafluoroacetylacetonato-copper(1) trimethylvinylsilane, isopropoxide, triethylphoshate, silicon tetrachloride, tantalum ethoxide, tetrakis(diethylamido) titanium (TDEAT), tetrakis(dimethylamido)titanium (TDMAT), bis-tertiarybutylamido silane, triethylborate, titanium tetrachloride, trimethylphosphate, trimethylorthosilicate, titanium ethoxide, tetramethyl-cyclo-tetrasiloxane, titanium n-propoxide, tris(trimethylsiloxy) boron, titanium isobutoxide, tris(trimethylsilyl)phosphate, 1,1,1,5,5,5-hexafluoro-2,4-pentanedione, tetramethylsilane and mixtures thereof.

The purgeable container for a chemical delivery system of the present invention will now be described with regard to a particular embodiment processing TDMAT as the low vapor pressure, high purity chemical delivered from the process container for transport to a process tool of a semiconductor fab.

In a bubbler, the liquid chemical is entrained in a pressurized gas, bubbler gas or carrier gas that is bubbled into the liquid chemical, as it resides in the process container, through a diptube which introduces the pressurized gas into the liquid chemical below the surface of the chemical. The pressurized gas entrains or vaporizes some of the chemical and the vapor leaves with the pressurized gas through an outlet communicating with the process tool.

Chemical delivery can also be accomplished by vapor draw, where a vacuum is applied to the outlet of the process container to induce the chemical to vaporize and leave via the outlet under vacuum conditions. This vapor draw can be accomplished with or without positive gas pressure assist from push gas directed into the process container from the inlet.

It is also possible to use the present invention in a liquid delivery to the process tool where the process container delivers liquid chemical out a diptube to the process tool by the action of pressurization gas or push gas on the headspace or liquid surface of the chemical in the process vessel (direct liquid injection or DLI).

Pressurizing gas can be any inert gas, such as nitrogen, argon, helium or the rare noble gases.

Purge gas is used to clean process conduits or lines when such conduits are off-line and subject to cleaning or removal of residual chemical.

With reference to FIG. 1A, a high purity chemical delivery system is illustrated wherein a first container 10 is outfitted with a first port 13 and a second port 11 to contain a low vapor pressure, high purity chemical, such as TDMAT, used in electronic device fabrication. The chemical can be removed from the container 10 via a diptube 15, through port 13, conduit 12 and into first block diaphragm valve assembly 14 containing two opposing diaphragm valves, first diaphragm valve 75 and second diaphragm valve 77, having their valve seat sides or low dead space sides facing one another to facilitate quick and thorough cleanout, as will be outlined in detail below with reference to FIGS. 2 and 3.

Valve seat sides of valves 75 and 77 have flow communication with a short, low dead space first conduit 16 having a first end 16*b* adjacent assembly 14 and a second end 16*a* adjacent a second block diaphragm valve assembly 20. Valve 75 provides flow communication for the low vapor pressure, high purity chemical from container 10, while valve 77 provides access to vent or vacuum for the wetted surface areas of first conduit 16 and the adjacent areas in first and second block diaphragm valve assemblies 14 and 20.

Figure 3:
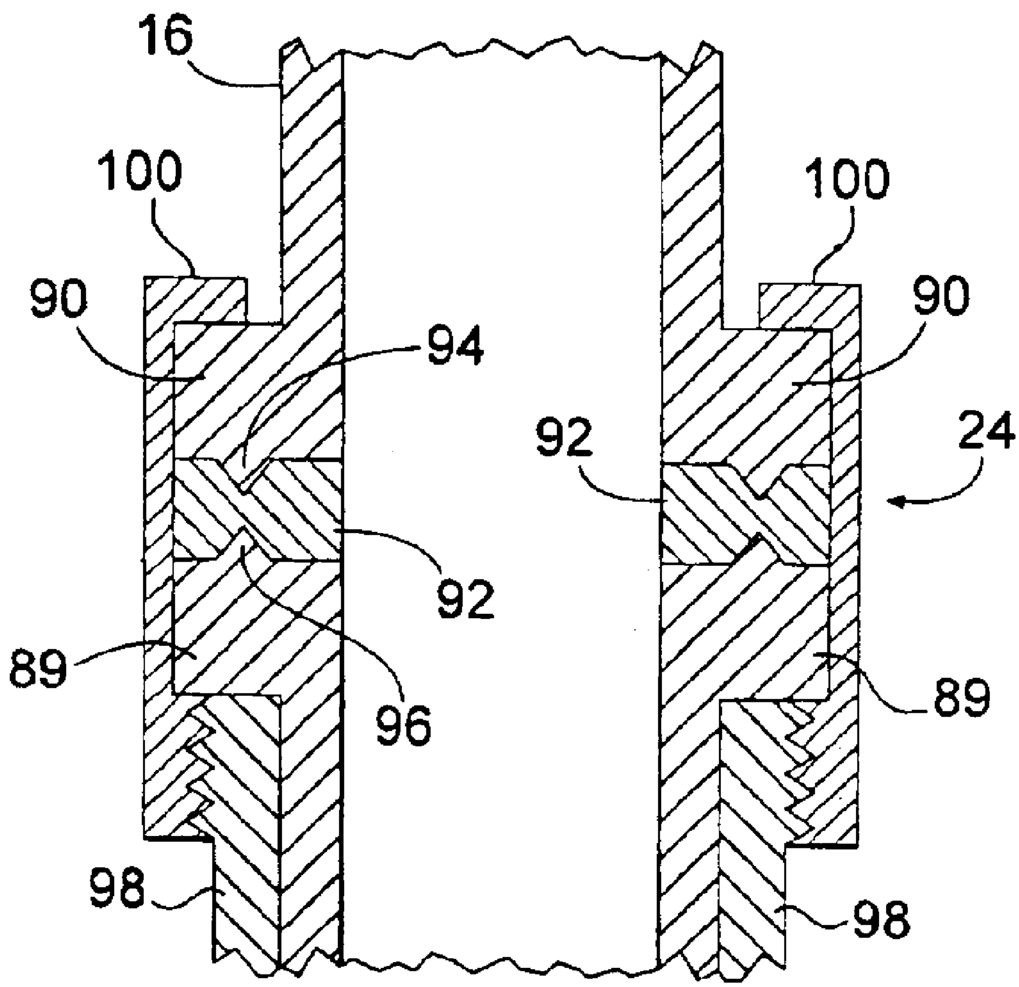
FIG. 3 is a partial cross-section view of the low dead space connector used in the first conduit of the present invention.

The first end 16*b* and the second end 16*a* of conduit 16 are separated by a low dead space connector 24 described in greater detail in reference to FIG. 3.

Second block diaphragm valve assembly 20 also has two opposing diaphragm valves, third diaphragm valve 85 and fourth diaphragm valve 87, which also have their valve seat sides or low dead space sides facing one another to facilitate quick and thorough cleanout, as will be outlined in detail below with reference to FIGS. 2 and 3. Valve 85 controls access to purge gas and or push gas to the wetted surface area of the first conduit 16 and the passages of the block diaphragm valve assemblies 14 and 20, and particularly, the valve seat sides of such valves offering the least dead space. Valve 87 controls delivery of chemical from container 10 to downstream dispense 110 of low vapor pressure, high purity chemical or alternatively carrier gas in a bubbling application.

Second port 11 of first container 10 is controlled by second valve means, such as valve 114, which in turn provides access to vacuum/vent, and or push gas through second conduit 118. Conduit 118 has a low dead space connector 116, which can be structured similar to the connection illustrated in FIG. 3, but it does not have to have that structure, because generally conduit 18 and 118 do not become exposed to low vapor pressure, high purity chemical in the normal operation as a liquid out container 10. Conduit 118 can be supplied with helium push gas or other non reactive or inert push gas through valve 124 and source of push gas 126. Push gas passes through open valve 124, line 118, connector 116, open valve 114, port 11 and into container 10 to pressurize the headspace above the contained low vapor pressure, high purity chemical, to dispense the chemical preferably in the liquid phase out diptube 15.

When container 10 needs replacement for refill or maintenance, valve 124 is closed, shutting off push gas, and vacuum from source 122 is introduced through open valve 120 into conduit 118 and passes through valve 114 (or up to valve 114 in a cycle purge sequence).

To take container 10 off line, it is necessary to break the connections at low dead space connectors 24, 19, and 116.

Connector 116 and 19 does not represent a problem, because typically, it has only been exposed to push gas or purge gas. However, connector 24 and line 16 present problems, because these wetted surfaces have been exposed to low vapor pressure, high purity chemical, such as TDMAT, which is adversely effected by atmospheric exposure and represents an operator risk, if TDMAT is allowed out into the ambient of the opened conduit 16.

Therefore, the wetted surfaces in conduit 16, between the diaphragm valves of block diaphragm valve assemblies 14 and 20, are minimized to create low dead space and to facilitate quick and thorough chemical removal, by the repetitious exposure of the wetted surfaces to vacuum and or vent through source 18 and purge gas, vent, or vacuum from conduit 112. These may be conducted alternately until vacuum is rapidly achieved in a short time interval, demonstrating thorough removal of low vapor pressure, high purity chemical from the wetted surface area. This allows opening of connector 24, along with connector 116 and 19 to take container 10 out of service for any reason. This structure has allowed clean out and purging of lines of low vapor pressure, high purity chemical in a fraction of the time historically required by the industry to accomplish the same goal. This allows faster service or replenishment with less down time and more online time for electronic fabricators using this type of equipment in comparison to historic equipment.

An important aspect to the efficient clean out and purging of the manifold of the present invention is to minimize wetted surface area and to simplify the valve surfaces, where chemical could be hung up during clean out and purging. The use of low dead space connectors 24, tandem sets of block diaphragm valve assemblies 14 and 20 and the opposing valve seat sides of diaphragm valves in the block valve assemblies, collectively allow the minimization of wetted surfaces and the avoidance of complex wetted surface areas susceptible to capture or retention of low vapor pressure, high purity chemical. This allows for quick cleanout, disconnect and reinstallation without loss of expensive chemical, without reaction of such chemical with atmospheric contaminants, without exposure of operators to reactive or toxic chemicals or their byproducts, without contamination of the wetted surface lines when the equipment is brought back online and avoids corrosion of the equipment by atmospheric contaminants or the reaction products of atmospheric contaminants and the chemical.

Figure 1B:
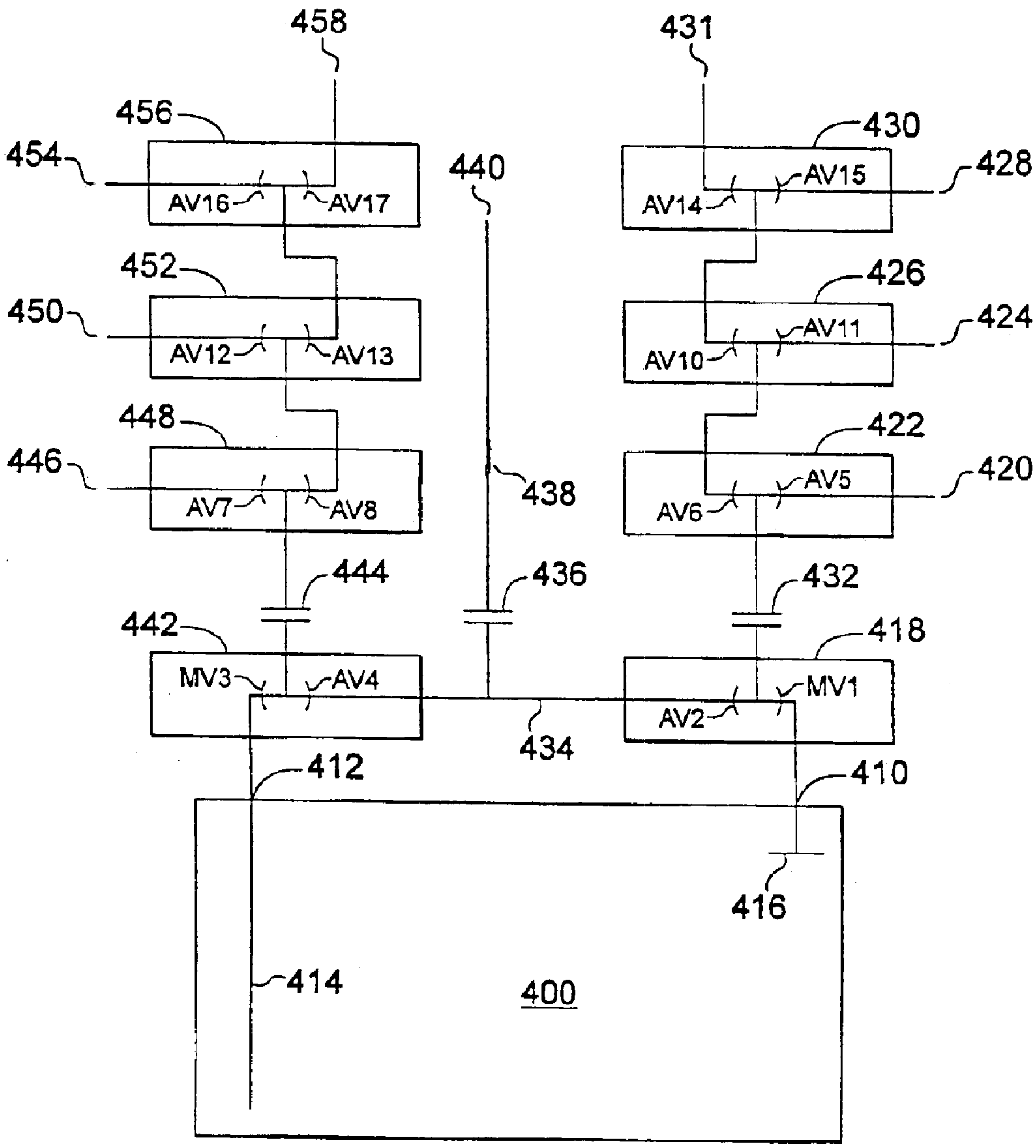
FIG. 1B is a schematic of a second embodiment of the present invention having several sets of block diaphragm valve assemblies on the inlet and outlet port of a container.

With reference to FIG. 1B, an alternative high purity chemical delivery system illustrates the use of a low dead space and minimized wetted surface area apparatus of the present invention. The block diaphragm valve assemblies of FIG. 1B have the same structure as detailed in FIGS. 2*a* and *b* and the same low dead space connections as detailed in FIG. 3. Container 400 can be used as either a liquid out chemical delivery system with chemical removed through diptube 414, through block diaphragm valve assembly 442, first conduit containing low dead space connector 444, second block diaphragm valve assembly 448 and chemical dispense conduit 446; or, alternatively, a push or bubbling gas can be administered through conduit 446, through block valve diaphragm assemblies 448 and 442, through port 412, down diptube 414, where it bubbles through the fill of liquid chemical contained in container 400 to be removed as a vapor through T-shaped orifice 416, port 410 block diaphragm valve assembly 418, the conduit containing low dead space connector 432, block diaphragm valve assembly 422 and conduit 420.

In either case, the tandem block diaphragm valve assemblies 418, 422, 442 and 448 with the low wetted surface area conduits and their attendant low dead space connectors 444, 436, and 432 allow disconnection of the container 400 from the rest of the manifold at the connectors 432, 436, and 444 in significantly less time than historically would be required for low vapor pressure chemical service.

The manifold for container 400 operates in the liquid out service by supplying push gas, such as inert gases such as helium, nitrogen or other nonreactive gases, through conduit 420 to block diaphragm valve assembly 422 having diaphragm valve AV5 open and diaphragm valve AV6 closed. Push gas passes through the conduit equipped with connector 432 to second valve means, such as block valve assembly 418 having diaphragm valve AV2 closed and diaphragm valve MV1 open, to allow push gas to enter port 410 and pass out of T-shaped orifice 416 to pressurize the head space above the liquid chemical level in container 400. This forces liquid chemical up and out diptube 414, through port 412 through open diaphragm valve MV3 past closed diaphragm valve AV4 through the first conduit having connector 444 into block diaphragm valve assembly 448 past closed diaphragm valve AV8 and out open diaphragm valve AV7 to dispense point 446 to a downstream vessel or reactor, such as a direct liquid injection furnace for semiconductor manufacture of electronic devices.

The manifold for container 400 can be operated in reverse to provide vapor chemical out by merely reversing the administration of push gas through conduit 446 through the same valve and conduit arrangement, wherein the push gas bubbles out of diptube 414 and entrains liquid chemical in a vapor stream which then flow out of T-shaped orifice 416 through the same status of opened and closed valves as mentioned above for assemblies 418 and 422, but with the vapor chemical being dispensed through conduit 420.

Because this manifold arrangement can be used in either liquid chemical out or vapor chemical out, with either array of block valves possibly having wetted surface contact with the low vapor pressure, high purity chemical, it may be appropriate to have vacuum, purge gas, venting and even solvent flush available to both sides of the manifold represented by assembly 418 and adjacent assemblies and assembly 442 and adjacent assemblies.

The manifold associated with port 412 can be cleaned by opening valve MV3, closing valve AV4, closing valve AV7, opening valve AV8, closing valve AV12, opening valve AV13, closing valve AV17 and opening valve AV16 in block diaphragm valve assembly 456 to use push gas source 454 to push liquid chemical back down into container 400 via port 412 and diptube 414. Then, purge gas source 458 can be turned on at high pressure for several minutes to remove nearly all chemical residue via AV17, AV13, connector 444, AV4, conduit 434 and vacuum/vent source 440. One may keep purge gas source 458 on at high pressure for several minutes or possibly even hours to remove nearly all chemical residue. Next valve AV4 is closed and AV16 is closed and valve AV12 in block diaphragm valve assembly 452 is opened to subject the wetted surface area of the manifold to vacuum. Alternatively if 440 is a vacuum vent source, then vacuum can be sourced by opening AV4 rather than AV12. To employ solvent purge capabilities, valve AV12 can be closed and valve AV4 can be opened and then solvent 458 administered to the wetted surface area of the manifold through open valve AV17, with any residual chemical and solvent (in the case when solvent is used) removed through the vent 440. Further iterations of purging and vacuum should be administered to remove the solvent (in the case when solvent is used) and establish that the wetted surface area of the manifold is clean. This is usually determined by detecting the time to get to a threshold level of vacuum in the system with the appropriate valves closed as described above for the vacuum cycle.

The wetted surface areas in the manifold associated with port 410 will require cleaning up through block diaphragm valve assembly 422 before disconnecting at connection 432. Valve AV2 is closed and valve AV15 is closed and valve AV11 is opened to subject the manifold associated with port 410 to vacuum source 424. Several cycles of purging and vacuum can be conducted for appropriate cleaning of the wetted surface area of the manifold associated with port 410. For even more thorough cleaning or removal of particularly low vapor pressure chemical, solvent can be administered by opening valves AV14, AV10, AV6 and AV2 and closing valves AV15, AV11, AV5 and MV1 to flow solvent from solvent source 431 through the manifold associated with port 410 and removing solvent and entrained chemical through vent/vacuum 440. Typically, after solvent cleaning, several iterations of purging and vacuum are desired to obtain sufficient cleaning of the manifold of solvent, with operation of the valves as described above for purge and vacuum operations.

The block diaphragm valve assemblies of FIG. 1B are listed with sequence numbers for clarity in Table 1, below.

TABLE 1

| | |
|---|---|
| First block diaphragm valve assembly | Part No. 442 |
| Second block diaphragm valve assembly | Part No. 448 |
| Third block diaphragm valve assembly | Part No. 452 |
| Fourth block diaphragm valve assembly | Part No. 456 |
| Fifth block diaphragm valve assembly | Part No. 418 |
| Sixth block diaphragm valve assembly | Part No. 422 |
| Seventh block diaphragm valve assembly | Part No. 426 |
| Eighth block diaphragm valve assembly | Part No. 430 |

The diaphragm valves of FIG. 1B (and a subset thereof for FIG. 1A) are listed with sequence numbers for clarity in Table 2, below.

TABLE 2

| | |
|---|---|
| First diaphragm valve | Part No. MV3 |
| Second diaphragm valve | Part No. AV4 |
| Third diaphragm valve | Part No. AV7 |
| Fourth diaphragm valve | Part No. AV8 |
| Fifth diaphragm valve | Part No. AV12 |
| Sixth diaphragm valve | Part No. AV13 |
| Seventh diaphragm valve | Part No. AV16 |
| Eighth diaphragm valve | Part No. AV17 |
| Ninth diaphragm valve | Part No. MV1 |
| Tenth diaphragm valve | Part No. AV2 |
| Eleventh diaphragm valve | Part No. AV5 |
| Twelfth diaphragm valve | Part No. AV6 |
| Thirteenth diaphragm valve | Part No. AV11 |
| Fourteenth diaphragm valve | Part No. AV10 |
| Fifteenth diaphragm valve | Part No. AV14 |
| Sixteenth diaphragm valve | Part No. AV15 |

Figure 2A:
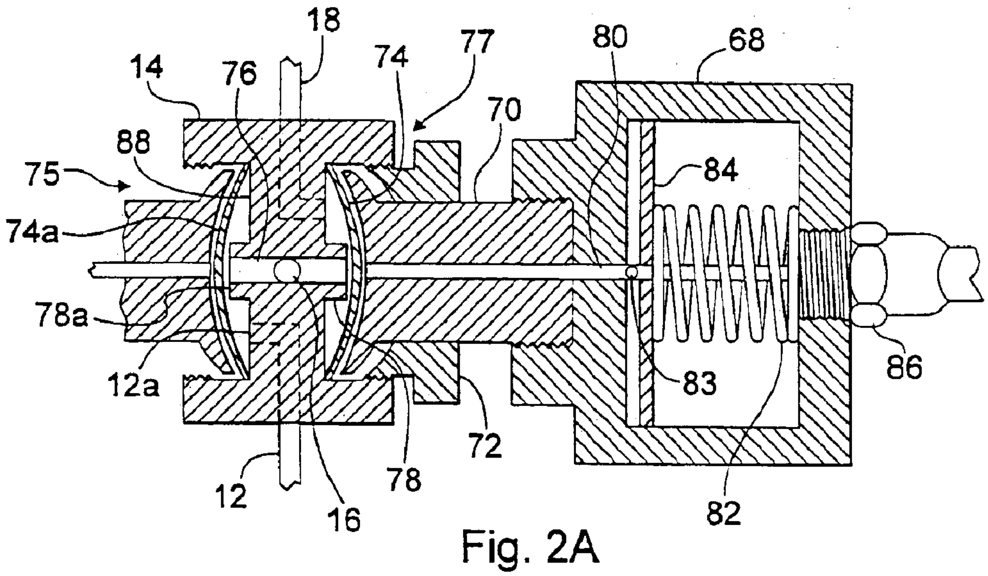
FIG. 2A is a partial cross-section of a block valve assembly with two diaphragm valves as used in each embodiment of the present invention.

FIG. 2A shows greater detail of first block diaphragm valve assembly 14, which is the same valve structure as second block diaphragm valve assembly 20 (which is not shown separately in detail for that reason). FIG. 2A is a partial cross-section of first block diaphragm valve assembly 14 showing liquid low vapor pressure, high purity chemical or second conduit 12 in flow communication with first diaphragm valve 75 comprising diaphragm 74*a* comprising a flexible metal disk with a convex side and a concave side comprising the valve seat side of the valve and valve seat 78*a*, as well as an actuator similar to that shown for valve 77.

Conduit 12 communicates with valve 75 through aperture 12*a*. The diaphragm side of the diaphragm comprises the cross-sectional triangular area between the concave surface of the diaphragm 74*a*, the floor of core 88 and the surface of valve seat 78*a* in the closed condition. Valve seat 78*a* engages the concave side of the diaphragm 74*a* and allows liquid low vapor pressure, high purity TDMAT to pass through the valve when the diaphragm disengages the valve seat 78*a*, to the short channel 76 to conduit 16 which connects with the second block valve assembly 20 and ultimately the dispense of chemical at dispense point 110. Diaphragm 74*a* is actuated by any means, such as manual actuator, electric solenoid, hydraulic pressure actuation or preferably as illustrated, a pneumatic actuator, illustrated for the other diaphragm valve of block diaphragm valve assembly 14.

Vacuum/vent are provided to first conduit 16 by way of conduit 18 and a second diaphragm valve 77 comprising diaphragm 74, valve seat 78, actuator connector 70, actuator armature 80, pneumatic actuator 68, bias spring 82, bellows or piston 84, which translates pneumatic pressure to valve actuation through armature 80 and pneumatic source 86. Pneumatic gas is supplied to bellows 84 by source 86 and a coaxial channel in armature 80 which communicates with bellows 84 through aperture 83. Pneumatic actuator is engaged to the diaphragm by locking nut 72. Second diaphragm valve 77 has a diaphragm side of its diaphragm 74 and a valve seat side, just as diaphragm valve 75. Valve 75 has a similar actuator structure as illustrated for valve 77.

The valve seat side of the diaphragm valves of the present invention have very little dead space or volume where a low vapor pressure liquid chemical can be retained. In addition, diaphragm valves 75 and 77 are juxtaposed to one another at their valve seat sides and connect to the conduit 16 via the very short channel 76 bored out of the monoblock of the block diaphragm valve assembly 14 base. Due to this advantageous arrangement of these two valves, it is possible to clean first conduit 16 by application of sequenced pressurizing gas and vacuum, without the need for additional means, such as solvents. Cleanout can be accomplished in a short interval, such as several minutes of sequenced pressurized gas and vacuum, in contrast to prior art systems which take several hours to several days to reach the prescribed level of residual chemical in the conduits prior to detachment of the conduits for maintenance or changeout of the container 10.

The valve seat side of the diaphragm valves comprises that portion of the valve in direct communication with the common conduit, such as 16, by way of the short channel, such as 76, and up to the sealing surface of the valve seat with the concave surface of the diaphragm when the valve is closed. The diaphragm side of the diaphragm valves comprises the other side of the sealing surface of the valve seat in communication with the aperture, such as 12*a*, and still under the concave side of the diaphragm. The diaphragm side of the diaphragm valve can be seen to constitute an annular, generally V-shaped cross-sectional space, which can potentially become wetted with chemical and constitute a difficult area to effectively and quickly clean of such chemical. Therefore, the present invention, by having the common conduit or first conduit 16 communicate directly with the valve seat side of the diaphragm valves of the first block valve assembly and by having the diaphragm valves juxtaposed to one another through a very short connection or channel 76, affords a low dead space valve arrangement, which can be readily cleaned by application of sequenced, repeated pressurized gas and vacuum, without the use of solvent.

The pneumatic actuator 68 has a source 86 of pressurized air for valve actuation. The valve 77 is a normally closed valve which is biased to the closed position by spring 82 operating on baffle 84 and actuator armature 80 which pushes against diaphragm 77 to engage the valve seat 78. Pressurized air passes through a coaxial tube through the center of spring 82 to an aperture 83 in the actuator armature 80, which is on the opposite side of baffle 84 from the spring 82. The air pressure acts against the baffle and spring to bias the diaphragm 77 open via the armature 80 and allow chemical to flow through the valve. This represents only one of several ways a pneumatic actuator operates and the operation of the pneumatic actuator is not an aspect of the present invention. Any of the known methods and apparatus for actuating using pneumatics can be contemplated, and in fact non-pneumatic actuation can be used, such as manual or solenoid actuation. Valve 75 is similarly equipped with valve actuation equipment, not illustrated, similar to 68, 70, 72 and 86.

Figure 2B:
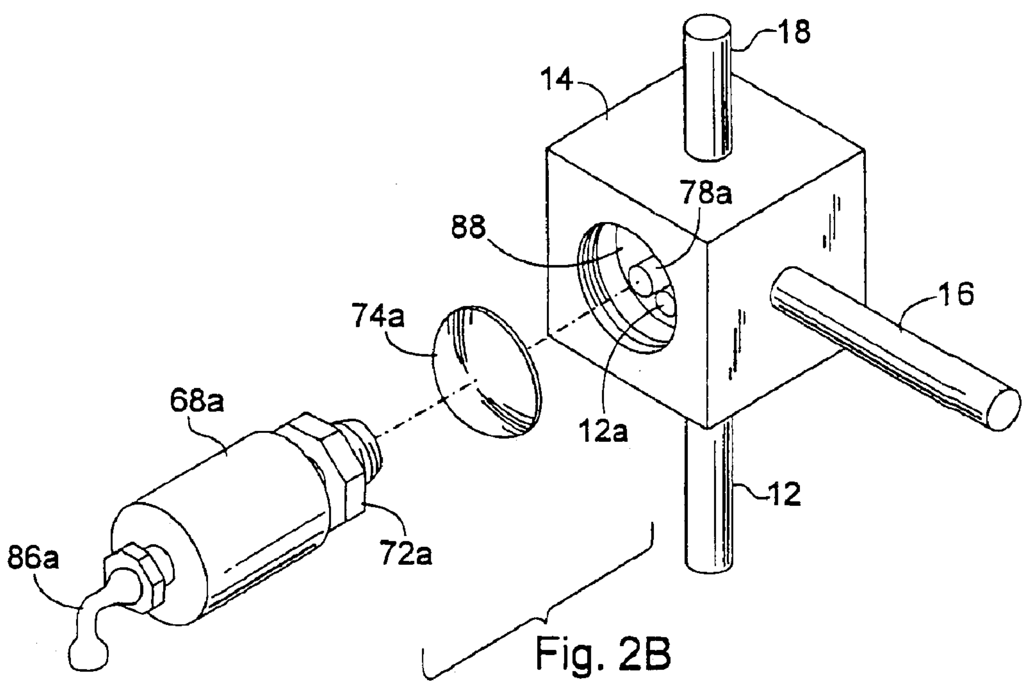
FIG. 2B is an isometric exploded view of the block diaphragm valve assembly of FIG. 2A showing the diaphragm and the pneumatic actuator removed from the block.

FIG. 2B shows an exploded perspective view of the block diaphragm valve assembly of FIG. 2A, this time showing the pneumatic actuator 68*a* for valve 75. The diaphragm valves' locations, illustrated for one valve as core 88, are bored out of a single monoblock of material, such as ceramics, plastics such as Teflon, or other suitable materials, but preferably is metal, such as electropolished stainless steel. Aperture 12*a* of second conduit 12 is illustrated to show the diaphragm side connection of the conduits in the valve. Valve seat 78*a* delineates the valve seat side of the sealing surface of the valve seat 78*a* and the diaphragm 74*a*, shown removed from its core location 88. Pneumatic actuator 68*a* is shown with its pneumatic gas source connection 86*a*. Conduits 12, 16*b* and 18 are shown, respectively, emanating from the monoblock of block diaphragm valve assembly 14.

Second block diaphragm valve assembly 20 is similar to first block valve assembly 14 as illustrated in FIG. 2A, with conduit 16 in this instance with regard to second block valve assembly 20 corresponding to the structure shown for first conduit 16, conduit 112 corresponding to the structure shown for second conduit 12, and conduit 110 corresponding to the structure shown for third conduit 18, as it relates to first block diaphragm valve assembly.

First low dead space connection 24 is illustrated in FIG. 3. Sealing surface 90 of first conduit 16 ends with an annular knife edge 94 depending axially from the sealing surface in the direction of the sealing surface 89 of the conduit 16, which also has an annular knife edge 96 depending axially from its sealing surface. These knife edges 94 and 96 engage an annular sealing gasket 92, which is preferably a relatively soft metal to form a low dead space connection with a superior seal. Compression fitting 100 threadably engages ring 98 to force the respective knife edges into sealing engagement with the annular soft metal gasket 92.

In FIGS. 1A and 1B the diaphragm valves are illustrated with a crescent or meniscus depiction to indicate the arrangement of the diaphragm itself with its diaphragm side and its valve seat side in accordance with the depiction of that orientation in FIG. 2A. Therefore, the concavity of the diaphragm valves in FIGS. 1A and 1B represent the valve seat side of the diaphragm valve having a low dead space and minimum wetted surface area and the convex side of the diaphragm valves in FIGS. 1A and 1B represents the diaphragm side of the diaphragm valve which has greater potential dead space and more potential wetted surface area, as described with regard to FIG. 2A above.

The present invention provides unique and unexpected improvement over the prior art in low vapor pressure, high purity chemical distribution from a container of the chemical by using a combination of two block diaphragm valve assemblies connected by a low dead space connection wherein the diaphragm valves have their valve seat sides facing one another in the block valve assemblies to provide a minimal wetted surface area for decontamination of the chemical at such times as container changeout or servicing. Clean out using the apparatus of the present invention has demonstrated drydown times of less than one hour where the prior art has taken days. This allows electronic device fabricators to minimize down time for change outs or service and to maximize utilization of the expensive equipment designed to produce electronic devices in fabs easily costing over $1 billion per plant to construct and operate.

The present invention has been set forth with regard to several preferred embodiments, but the full scope of the present invention should be ascertained from the claims below.

What is claimed is:

1. A purgeable container (10) for low vapor pressure, high purity chemicals for a high purity chemical delivery system, comprising:

(a) a container (10) for containing a quantity of said low vapor pressure, high purity chemical having at least two ports (11, 13) capable of receiving or dispensing said low vapor pressure, high purity chemical;

(b) a first block diaphragm valve assembly (14) having first (75) and second (77) diaphragm valves, each diaphragm valve having a diaphragm (74*a*) and having a valve seat side (78*a*) and a diaphragm side (88), wherein the valve seat side (78*a*) of each diaphragm valve (75) is juxtaposed to the other valve seat side (78) of the other diaphragm (74), and each valve seat side of each diaphragm valve (75, 77) positioned to have low vapor pressure, high purity chemical flow communication with a conduit (16) of said high purity chemical delivery system, and said diaphragm side (88) of said first diaphragm valve (75) having flow communication with a first (13) of said at least two ports, and said diaphragm side of said second diaphragm valve (77) positioned to have flow communication with a conduit (18) capable of a function selected from the group consisting of a source of vacuum, or a source of vent;

(c) a second valve means (114) having flow communication with a conduit (118) capable of a function selected from the group consisting of a source of push gas, a source of vacuum, a dispense for low vapor pressure, high purity chemical; and (d) said second port (11) having flow communication with said container (10) and capable of a function selected from the group consisting of a source of vacuum to said container (10), delivering push gas to said container (10) and dispensing low vapor pressure, high purity chemical in a push gas from said container (10).

2. The container of claim 1 wherein said valve seat side of said second diaphragm valve has flow communication with a conduit for a source of high pressure purge gas that is used to purge residual low volatility chemical from the wetted surface to vent or vacuum via the container port or vent/vacuum port.

3. The container of claim 2 wherein said second valve means (114) has flow communication with a conduit (118) for a source of vacuum (122).

4. The container of claim 1 wherein said second valve means (114) has flow communication with a conduit (118) for dispense of low vapor pressure, high purity chemical.

5. The container of claim 1 wherein said diaphragm side of said second diaphragm valve (77) has flow communication with a conduit (18) for a source of vacuum.

6. The container of claim 1 wherein said diaphragm side of said second diaphragm valve (77) has flow communication with a conduit (18) for a source of vent.

7. The container of claim 5 wherein said second valve means (114) has flow communication with a conduit (126) for purge gas.

8. A purgeable container (400) for low vapor pressure, high purity chemicals for a high purity chemical delivery system, comprising:

(a) a container (400) for containing a quantity of said low vapor pressure, high purity chemical having at least two ports (410, 412) capable of receiving or dispensing said low vapor pressure, high purity chemical;

(b) a first block diaphragm valve assembly (442) having first (MV3) and second (AV4) diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve positioned to have low vapor pressure, high purity chemical flow communication with a conduit of said high purity chemical delivery system, and said diaphragm side of said first diaphragm valve (MV3) having flow communication with a first (412) of said at least two ports, and said diaphragm side of said second diaphragm valve (AV4) positioned to have flow communication with a conduit (434) capable of a function selected from the group consisting of a source of vacuum, or a source of vent;

(c) another block diaphragm valve assembly (418) having two diaphragm valves (MV1, AV2), each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having flow communication with a second conduit, and said diaphragm side of one (MV1) of said two diaphragm valves having flow communication with a second (410) of said at least two ports, and said diaphragm side of the other (AV2) of said two diaphragm valves having flow communication with a conduit (434) capable of a function selected from the group consisting of a source of vacuum, or a source of vent; and (d) said second port (410) having flow communication with said container (400) and capable of a function selected from the group consisting of delivering push gas to said first container, a source of vacuum and dispensing low vapor pressure, high purity chemical in a push gas from said container (400).

9. A purgeable container (400) for low vapor pressure, high purity chemicals for a high purity chemical delivery system, comprising:

(a) a container (400) for containing a quantity of said low vapor pressure, high purity chemical having at least two ports (410, 412) capable of receiving and dispensing, respectively, said low vapor pressure, high purity chemical;

(b) a first block diaphragm valve assembly (442) having first (MV3) and second (AV4) diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve positioned to have low vapor pressure, high purity chemical flow communication with a dispense conduit (446) of said high purity chemical delivery system, and said diaphragm side of said first diaphragm valve (MV3) having flow communication with a first (412) of said at least two ports and a diptube (414), and said diaphragm side of said second diaphragm valve (AV4) positioned to have flow communication with a conduit (434) capable of a function of a source of vent or vacuum;

(c) a second valve means (418) positioned to have flow communication with a source of push gas and/or a source of vacuum; and (d) said second port (410) having flow communication with said container (400) and capable of delivering push gas and/or vacuum to said container (400).

10. A purgeable container (400) for low vapor pressure, high purity chemicals for a high purity chemical delivery system, comprising:

(a) a container (400) for containing a quantity of said low vapor pressure, high purity chemical having at least two ports (410, 412) capable of receiving and dispensing, respectively, said low vapor pressure, high purity chemical;

(b) a first block diaphragm valve assembly (442) having first (MV3) and second (AV4) diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve positioned to have flow communication with a conduit (446) for a bubbling gas, and said diaphragm side of said first diaphragm valve having flow communication with a first (412) of said at least two ports, and said diaphragm side of said second diaphragm valve (AV4) positioned to have flow communication with a source of vent or vacuum (434);

(c) another block diaphragm valve assembly (418) having two diaphragm valves (MV1, AV2), each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve positioned to have flow communication with a second conduit, and said diaphragm side of one (MV1) of said two diaphragm valves having flow communication with a second (410) of said at least two ports, and said diaphragm side of the other (AV2) of said two diaphragm valves positioned to have flow communication with a source of vent or vacuum (434); and (d) said second port (410) having flow communication with said container (400) and capable of dispensing low vapor pressure, high purity chemical in a push gas from said container (400).

* * * * *